United States Patent
Mucenieks

(12) 
(10) Patent No.: US 6,359,508 B1
(45) Date of Patent: Mar. 19, 2002

(54) DISTORTION DETECTION APPARATUS FOR CONTROLLING PREDISTORTION, CARRIER CANCELLATION AND FEED-FORWARD CANCELLATION IN LINEAR RF POWER AMPLIFIERS

(75) Inventor: Lance Todd Mucenieks, Boulder Creek, CA (US)

(73) Assignee: Spectrian Corporation, Sunnyvale, CA (US)

(*) Notice: Subject to any disclaimer, the term of this patent is extended or adjusted under 35 U.S.C. 154(b) by 0 days.

(21) Appl. No.: 09/641,090

(22) Filed: Aug. 17, 2000

(51) Int. Cl.[7] .................................................. H03F 1/26
(52) U.S. Cl. ...................................... 330/149; 330/151
(58) Field of Search .......................... 330/52, 136, 149, 330/151

(56) References Cited

U.S. PATENT DOCUMENTS

| | | | |
|---|---|---|---|
| 4,580,105 A | 4/1986 | Myer | 330/149 |
| 4,885,551 A | 12/1989 | Myer | 330/52 |
| 5,119,040 A | 6/1992 | Long et al. | 330/149 |
| 5,489,875 A | 2/1996 | Cavers | 330/151 |
| 5,565,814 A | 10/1996 | Fukuchi | 330/52 |
| 5,742,201 A | 4/1998 | Eisenberg et al. | 330/2 |
| 5,877,653 A | 3/1999 | Kim et al. | 330/149 |
| 5,923,214 A | 7/1999 | Mitzlaff | 330/52 |
| 5,929,704 A | 7/1999 | Proctor, Jr. et al. | 330/149 |
| 6,078,216 A | 6/2000 | Proctor, Jr. | 330/151 |
| 6,111,462 A * | 8/2000 | Mucenieks et al. | 330/149 |
| 6,144,255 A | 11/2000 | Patel et al. | 330/151 |
| 6,275,106 B1 * | 8/2001 | Gomez | 330/151 |

* cited by examiner

Primary Examiner—Steven J. Mottola
(74) Attorney, Agent, or Firm—Allen, Dyer, Doppelt, Milbrath & Gilchrist, P.A.

(57) ABSTRACT

RF power amplifier distortion can be accurately measured in the presence of multi-carrier input signals, by using a common swept local oscillator to tune RF input and output receivers, whose outputs are monitored for distortion correction purposes. In carrier cancellation and feedforward cancellation mode, when the power detected by the input receiver exceeds a power threshold, the processor accumulates a digital representation of uncancelled carrier energy detected by the output receiver when sampling the signal at the output of the carrier cancellation combiner. It otherwise accumulates uncancelled IMD sampled at the output of the amplifier downstream of the feedforward cancellation coupler. In predistortion mode, the output receiver monitors only the output of the carrier cancellation combiner. When the power detected by the input receiver does not exceed the carrier power threshold, any energy measured by the output receiver corresponds to residual distortion energy from the predistorted main amplifier. This allows predistortion to be adaptively controlled by minimizing accumulated energy detected by the output receiver when it monitors the output of the carrier cancellation combiner during the entire sweep.

20 Claims, 1 Drawing Sheet

DISTORTION DETECTION APPARATUS FOR CONTROLLING PREDISTORTION, CARRIER CANCELLATION AND FEED-FORWARD CANCELLATION IN LINEAR RF POWER AMPLIFIERS

FIELD OF THE INVENTION

The present invention relates in general to radio frequency (RF) communication systems, and is particularly directed to an RF power amplifier distortion detection and correction mechanism, that employs a pair of frequency swept input and output receivers to locate and isolate the RF carrier component in each of predistortion, carrier cancellation and feed-forward cancellation loops of an RF power amplifier circuit, so that distortion energy associated therewith may be detected. Once detected, distortion energy may be removed by controlling the parameters of a pre-distortion unit and a gain/phase adjustment unit installed in the predistortion path to the main amplifier, and a gain/phase adjustment unit installed in the feed-forward cancellation path.

BACKGROUND OF THE INVENTION

The specifications and regulations of the Federal Communications Commission (FCC) currently mandate that communication service providers comply with very strict bandwidth constraints, including the requirement that the amount of energy spillover outside a licensed channel or band of interest, be sharply attenuated (e.g., on the order of 50 dB). Although such limitations may be overcome for traditional forms of modulation, such as FM, they are difficult to achieve using more contemporary, digitally based modulation formats, such as M-ary modulation.

Attenuating sidebands sufficiently to meet industry or regulatory-based standards using such modulation techniques requires very linear signal processing systems and components. Although relatively linear components can be obtained at a reasonable cost for the relatively low operating frequencies (baseband) of telephone networks, linearizing components such as power amplifiers at RF frequencies can be prohibitively expensive.

A fundamental difficulty in linearizing an RF power amplifier is the fact that it is an inherently non-linear device, and generates unwanted intermodulation distortion products (IMDs). IMDs manifest themselves as spurious signals in the amplified RF output signal, separate and distinct from the RF input signal. A further manifestation of IMD is spectral regrowth or spreading of a compact spectrum into spectral regions that were not occupied by the RF input signal. This distortion causes the phase-amplitude of the amplified output signal to depart from the phase-amplitude of the input signal, and may be considered as an incidental (and undesired) amplifier-sourced modulation of the RF input signal.

A straightforward way to implement a linear RF power amplifier is to build it as a large, high power device, but operate the amplifier at a only a low power level (namely, at a small percentage of its rated output power), where the RF amplifier's transfer function is relatively linear. An obvious drawback to this approach is the overkill penalty—a costly and large sized RF device. Other prior art techniques which overcome this penalty include feedback correction techniques, feedforward correction, and pre-distortion correction.

Feedback correction techniques include polar envelope correction (such as described in U.S. Pat. No. 5,742,201), and Cartesian feedback, where the distortion component at the output of the RF amplifier is used to directly modulate the input signal to the amplifier in real time. Feedback techniques possess the advantage of self-convergence, as do negative feedback techniques in other fields of design. However, systems which employ negative feedback remain stable over a limited bandwidth, which prevents their application in wide-bandwidth environments, such as multi-carrier or W-CDMA. Feedforward and predistortion correction, however, are not limited in this regard. In the feedforward approach, error (distortion) present in the RF amplifier's output signal is extracted, amplified to the proper level, and then reinjected with equal amplitude but opposite phase into the output path of the amplifier, so that (ideally) the RF amplifier's distortion is effectively canceled.

When predistortion correction is used, a signal is modulated onto the RF input signal path upstream of the RF amplifier. The characteristic of an ideal predistortion signal is the inverse of the distortion expected at the output of the high power RF amplifier, so that when subjected to the distorting transfer function of the RF amplifier, it effectively cancels the distortion behavior.

Either predistortion or feedforward may be made adaptive by extracting an error signal component at the output of the RF amplifier and then adjusting the control signal(s), in accordance with the extracted error behavior of the RF amplifier, so as to effectively continuously minimize distortion in the amplifier's output.

One conventional mechanism for extracting the error signal component involves injecting a pilot (tone) signal into the signal flow path through the amplifier and measure the amplifier's response. A fundamental drawback of using a pilot tone is the need for dedicated pilot generation circuitry and the difficulty of extracting and measuring the pilot tone within the signal bandwidth of the amplifier. Other approaches employ a high intercept receiver to detect low level distortion in the presence of high power carriers, which adds substantial complexity and cost.

SUMMARY OF THE INVENTION

In accordance with the present invention, RF power amplifier distortion is accurately measured, even in the presence of multi-frequency input signals, by using a controllably swept local oscillator to tune respective RF input and output receivers, the energy content of which is monitored for distortion correction purposes. Power detected by the input receiver, which is coupled to monitor the RF input to a main RF power amplifier, is compared with a carrier power threshold to determine the presence of carrier at the main amplifier's input.

A predistortion RF signal flow path from the RF input port to the main amplifier includes a gain/phase adjustment circuit controlled by amplitude and phase adjustment signals from a performance monitoring and parameter updating digital signal processor (DSP). The DSP executes one or more error minimization algorithms (e.g., power or least mean squared) for adjusting parameters imparted to respective signal transport loops associated with the amplifier, as will be described. The signal transport path further includes a predistortion unit which is operative to dynamically adjust the amplitude and phase of the RF input signal to main RF amplifier and may contain a vector modulator driven by a complex polynomial work function. The predistortion unit is coupled to receive weighting coefficients from the DSP.

A portion of the output of the main RF amplifier representative of the amplified original RF input signal and any IMDs introduced by the RF amplifier is coupled to a carrier cancellation combiner, which is operative to cancel, from the output of the RF amplifier, a delayed (time aligned) RF carrier component supplied by an RF error signal flow path from the carrier cancellation combiner, so as to provide an RF error signal representative of IMDs. The RF input signal flow path is further coupled to the RF carrier cancellation combiner. The RF error signal produced by the RF cancellation combiner is coupled to a DSP-controlled gain/phase adjustment circuit in the signal flow path to a feed-forward RF error amplifier, whose output is reinjected into the output path of the main RF amplifier.

In order to monitor the RF input signal for the presence of carrier energy, the signal flow path to the carrier cancellation combiner is coupled to a mixer within a controllably swept input receiver. A controllably swept output receiver includes a mixer coupled to receive the output of a DSP-controlled multiplexer or switch. The switch has a first input port coupled to the output of the carrier cancellation combiner, and a second input port coupled to the output path of the main RF amplifier. Each of the input and output receivers shares a common local oscillator (LO) which is controllably swept in frequency by a digital sweep-control signal applied by the DSP.

The IF output of the input receiver's mixer is filtered by a wider band bandpass filter and coupled to a carrier power detector. The carrier power detector is coupled to a threshold detector, the output of which is coupled to a carrier detect input of the DSP. When the output of carrier power detector does not exceed a prescribed threshold associated with an RF carrier signal, the output of the threshold detector is at a first logic state. However, if the carrier power detector detects carrier power in excess of the prescribed threshold, the output of the threshold detector changes to a second logic state. This change in state of the output of the threshold detector is used by the DSP to control the operation of the switch and thereby the signal path to the output receiver.

The output receiver's mixer has its IF output coupled through a narrower band bandpass filter and an IF buffer amplifier to a distortion power detector. The distortion power detector is coupled through a lowpass filter, digitized and coupled to the DSP. The digitized output of the distortion power detector is integrated and processed by the DSP using one or more error minimization algorithms for controlling the components in the predistortion and feed-forward loops.

During carrier cancellation and feedforward cancellation mode, whenever the power detected by the swept input receiver exceeds the power reference, the signal path through the swept output receiver is multiplexed through the switch to a coupler sampling output of the carrier cancellation combiner. During the sweep of the input and output receivers, the processor stores a digital representation of energy detected by the output receiver into one of two energy accumulation bins. The first bin is a measure of the uncancelled carrier energy at the output of the carrier cancellation combiner. The second bin is a measure of the uncancelled IMD energy at the output of the feedforward amplifier. The two loops may be controlled by minimizing the energy accumulated in their respective bins.

When operating in predistortion mode, the switch is controlled so that the output receiver monitors only the carrier cancellation combiner throughout the sweep. Whenever carrier power is detected by the input receiver, as the input and output receivers are swept, the energy measured by the output receiver will correspond to residual carrier energy at the output of the carrier cancellation combiner and is accumulated in the first bin. When no carrier power is detected by the input receiver as the input and output receivers are swept, the energy measured by the output receiver corresponds to residual distortion energy from the predistorted main amplifier and is accumulated in the second bin. This allows predistortion to be adaptively controlled by minimizing the energy accumulated in the second bin, during a sweep where the output receiver monitors only the carrier cancellation combiner.

BRIEF DESCRIPTION OF THE DRAWINGS

The single FIGURE diagrammatically illustrates an RF power amplifier distortion measurement and correction scheme in accordance with the invention.

DETAILED DESCRIPTION

Figure 1:
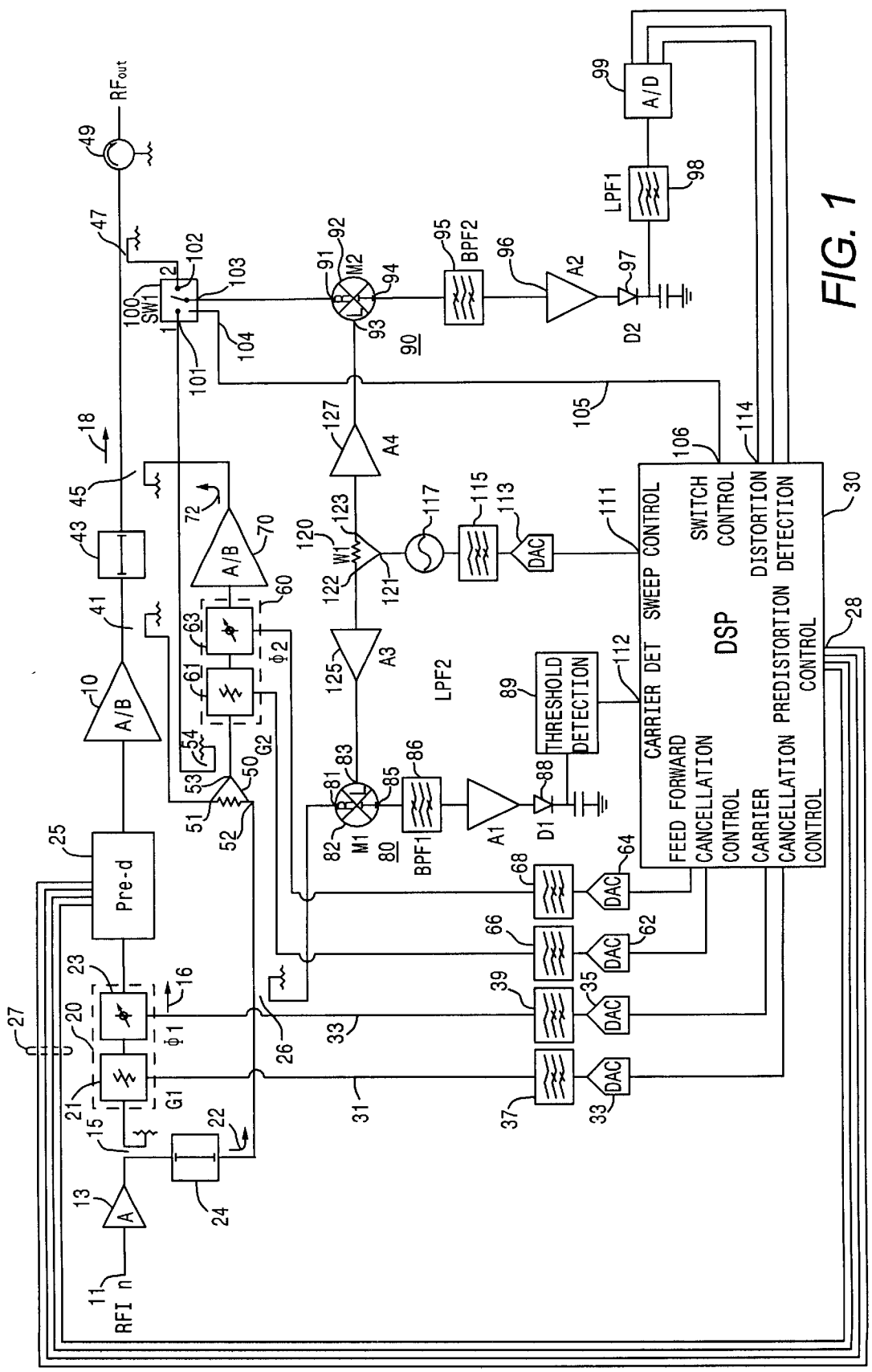

Before describing in detail the new and improved RF power amplifier distortion measurement and correction mechanism in accordance with the present invention, it should be observed that the invention resides primarily in a prescribed arrangement of conventional RF communication circuits, associated digital signal processing components and attendant supervisory control circuitry, that controls the operation of such circuits and components. In terms of a practical implementation that facilitates its manufacture as a printed circuit-based package, this modular arrangement may be readily implemented as an application specific integrated circuit (ASIC) chip set.

As a consequence, the configuration of such circuits components, and the manner in which they interface with other communication system equipment have, for the most part, been illustrated in the drawings by a readily understandable block diagram, which shows only those details that are pertinent to the present invention, so as not to obscure the disclosure with details which will be readily apparent to those skilled in the art having the benefit of the description herein. Moreover, although various circuit components are diagrammatically shown using analog symbology, it is to be understood that the invention is not limited thereto, but may be implemented using digital components. As a non-limiting example, the analog input and output receivers may be readily replaced by digital receivers, that allow bandwidth and selectivity of their associated IF filters to be programmable.

Attention is now directed to the single FIGURE, which diagrammatically illustrates a non-limiting example of a swept oscillator-based RF power amplifier distortion measurement and correction scheme in accordance with the present invention. As shown therein, an RF input signal $RF_{in}$ to be amplified is coupled to an input port 11 of a signal input path to a main RF power amplifier 10, the distortion characteristic of which is to be measured and compensated. For purposes of the present description it may be assumed that RF amplifier 10 has a relatively "low" carrier to intermod ratio (C/I). By relatively low C/I ratio RF amplifier is meant one in which the RF carriers and intermodulation products have similar power spectral densities either due to strong non-linearities in the amplifier or the mixed modulation format of the multicarrier signals being amplified.

The RF input port 11 is coupled through an input buffer amplifier 13 and directional coupler 15 to a predistortion RF signal flow path 16 to the main amplifier 10. The predistortion signal path 16 includes a gain/phase adjustment circuit 20, which may comprise respective RF amplitude and phase adjustment circuits 21 and 23, that are controlled by amplitude and phase adjustment signals ($G_1$, $\Phi_1$), sourced on respective control lines 31 and 33 from a performance monitoring and parameter updating digital signal processor (DSP) 30. DSP 30 executes one or more error minimization algorithms (e.g., power or least mean squared) for adjusting parameters imparted to respective signal transport loops associated with the amplifier, as will be described. The control lines 31 and 33 contain associated digital-to-analog converters (DACs) 33 and 35 and associated low pass filters 37 and 39. (A respective digital (gain/phase) control signal from the DSP 30 is converted into analog format by the DAC and then low pass-filtered for application to the controlled element.)

The signal transport path 16 further includes a predistortion unit 25, which is operative to dynamically adjust the amplitude and phase of the RF input signal to main RF amplifier 10, and may contain a vector modulator driven by a complex polynomial work function. Predistortion unit 25 is coupled to receive weighting coefficients $w_0, w_1, w_2, \ldots, w_N$, supplied over multi-link 27 from predistortion control ports 28 of the DSP 30.

The main RF power amplifier 10 has an output path 18 that includes a series arrangement of a directional coupler 41, delay unit 43, directional couplers 45 and 47 and output circulator 49 to an RF output port $RF_{out}$. The directional coupler 41 is used to couple a portion of the output of the main RF amplifier 10 representative of the amplified original RF input signal and any IMDs introduced by the RF amplifier 10 to a first input port 51 of a carrier cancellation combiner 50 (such as a Wilkinson splitter/combiner, as a non-limiting example).

The carrier cancellation combiner 50 is operative to cancel, from the output of the RF amplifier 10, a delayed (time aligned) RF carrier component supplied by an RF reference signal flow path 22 to the carrier cancellation combiner 50. The error signal which results from the cancellation of carriers in the combiner 50 is fed through a DSP-controlled gain/phase adjustment circuit 60 and a feed-forward RF error amplifier 70 of a feed-forward error correction and reinjection loop 72, so as to provide an RF error signal representative of the IMDs.

The delay unit 43 provides an effective delay corresponding to the insertion delay of components encountered in the RF error signal flow path 22 through the carrier cancellation combiner 50, gain/phase adjustment circuit 60 and feed-forward RF error amplifier 70 of the feed-forward error correction and reinjection loop 72.

The RF input signal flow path through the directional coupler 15 is further coupled to a delay unit 24 installed in the RF reference signal flow path 22. The output of the delay unit 24 is coupled to a second port 52 of the RF carrier cancellation combiner 50. The delay unit 24 provides a delay corresponding to the insertion delay imparted to the predistortion RF signal flow path 16 by the gain/phase adjustment 20, the predistortion unit 25 and the main RF amplifier 10.

The RF error signal produced by the RF cancellation combiner 50 is coupled to the DSP-controlled gain/phase adjustment circuit 60 in the signal flow path to the feed-forward RF error amplifier 70. The output of the feed-forward RF error amplifier 70 is reinjected into the output path 18 of the main RF amplifier 10 by way of reinjection directional coupler 45, downstream of delay unit 43.

Like the gain/phase adjustment circuit 20 in the predistortion path 16 to the main RF amplifier 10, the gain/phase adjustment circuit 60 for the feed-forward amplifier 70 may comprise respective amplitude and phase control units 61 and 63. The amplitude and phase control units 61 and 63 have their respective control inputs coupled to receive amplitude and phase adjustment signals ($G_2/\Phi_2$) sourced from the DSP 30. The control inputs to the units 61 and 63 are coupled through associated digital-to-analog converters (DACs) 62 and 64 and associated low pass filters 66 and 68. (As described above, a respective digital (gain/phase) control signal from the DSP 30 is converted into analog format by the DAC and then low pass-filtered for application to the controlled element.) In order to monitor the RF input signal for the presence of carrier energy, a directional coupler 26 is installed in the signal flow path 22 to the carrier cancellation combiner 50. The output of the directional coupler 26 is coupled to a first input 81 of a mixer 82 within a controllably swept input receiver 80. A similar, controllably tuned or swept output receiver 90 includes a mixer 92 having a first input 91 coupled to the output 103 of a DSP-controlled switch 100.

Switch 100 has a first input 101 coupled to a directional coupler 54, installed downstream of the output 53 of the carrier cancellation combiner 50. A second input 102 of the switch 100 is coupled to the directional coupler 47 installed downstream of the directional coupler 45 in the output path 18 of the main RF amplifier 10. A control port 104 of the switch 100 is coupled over a line 105 to a switch control output 106 of the DSP 30.

Each of the input and output receivers 80, 90 is controlled by a digital sweep-control signal generated by the DSP 30. For this purpose, a digital sweep-control signal port 111 is coupled to a digital-to-analog converter (DAC) 113, which produces an analog output sweep voltage, that is filtered in a low pass filter 115 and coupled to a voltage controlled oscillator (VCO) 117. The output of the VCO 117 is coupled to an input port 121 of a Wilkinson splitter 120. Wilkinson splitter 120 has a first output port 122 coupled through a buffer amplifier 125 to a second input 83 of mixer 82, and a second output port 123 coupled through a buffer amplifier 127 to a second input 93 of mixer 92. The IF output 85 of mixer 82 is filtered by a wider band bandpass filter 86 and coupled through a buffer amplifier 87 to a carrier power detector 88, shown as a diode, the cathode of which is capacitor-coupled to ground.

The carrier power detector 88 has its output coupled to a threshold detector 89, the output of which is coupled to a carrier detect input 112 of the DSP 30. In the absence of the output of carrier power detector 88 exceeding a prescribed threshold associated with an RF carrier signal, the output of the threshold detector 89 is at a first logic state. However, if the carrier power detector 88 detects carrier power in excess of the prescribed threshold, the output of the threshold detector 89 changes to a second logic state. This change in state of the output of the threshold detector 89 is used by the DSP 30 to control the operation of the switch 100, and thereby the signal path to the mixer 92 of the output receiver 90.

Mixer 92 has its IF output 94 coupled through a narrower band bandpass filter 95 and IF buffer amplifier 96 to a (distortion) power detector 97, shown as a diode whose cathode is capacitor-coupled to ground, and which serves to measure the distortion power within the output receiver bandwidth generated by RF amplifier 10. The distortion power detector 97 has its output coupled through a lowpass filter 98 to an analog-to-digital converter (ADC) 99, the digitized output of which is coupled to a distortion detection input 114 of the DSP 30. As described above, this digitized output of the distortion power detector 98 is integrated and processed by the DSP 30 using one or more error minimization algorithms for controlling the components in the predistortion and feed-forward loops.

As pointed out briefly above, the RF power amplifier distortion detection and correction mechanism of the present invention has three modes of operation: 1) carrier cancellation; 2) feed-forward cancellation; and 3) predistortion linearization.

Carrier and Feed-Forward Cancellation

In carrier and feed-forward cancellation mode, the DSP initially sets the flow path through the switch 100 from input port 102 to output port 103 so as to couple the output of the main RF amplifier 10 from the directional coupler 47 installed in output path 18 to the swept output receiver 90. As the DSP 30 sweeps the control voltage to the VCO 117, the tuning frequency for each of the input and output receivers 80 and 90 is swept in common. During this frequency sweep, the RF input signal power monitored by the carrier power detector 88 of the input receiver 80 is applied to threshold detector 89, whose threshold differentiates between carriers and distortion.

As long as the threshold of the threshold detector 89 is not exceeded, it is inferred that the digitized power output from the swept output receiver 90 and supplied to the distortion detection input 114 of the DSP 30 is uncancelled distortion power produced in the main RF power amplifier 10. As pointed out previously, the DSP 30 will store (a digital representation of) the energy monitored at the output of the amplifier by way of the second input port 102 of the switch 100 into that prescribed (second) energy bin associated with feedforward cancellation.

However, whenever the power to the input receiver 80 as detected by the detector 88 exceeds the power reference of threshold detector 89, it is inferred that the output receiver is tuned near RF carrier energy, so that the output of the threshold detector 89 changes to its second logic state. This causes the DSP 30 to change the signal path through the switch 100 from input port 102 to input port 101. As a result, the digital representation of the energy produced by the output receiver 90 is considered to be associated with uncancelled carrier(s) and is therefore stored by the DSP 30 into that (first) energy bin associated with the output of the carrier cancellation combiner 50.

Namely, this first bin is used to accumulate residual carrier energy from the carrier cancellation loop 22 which appears at the output of the carrier cancellation combiner 50, while the second bin accumulates residual IMD energy which appears at the output path 18 of the main RF amplifier 10. The carrier cancellation and feedforward cancellation loops may be controlled by minimizing the energy accumulated in their respective bins.

Predistortion Measurement

In order to measure predistortion, the DSP 30 maintains the path through the switch 100 derived from its input port 101, such that the output receiver 90 monitors the output of the carrier cancellation combiner 50 throughout the entire frequency (VCO) sweep. As the input and output receivers 80 and 90 are swept, and carrier power is detected by the input receiver's detector 88, any power measured by the output receiver's detector 98 will correspond to residual carrier energy at the output of the carrier cancellation combiner 50. In response to the associated change in state of the output of threshold detector 89, DSP 30 stores this energy in the first bin.

When no carrier power is being detected by the input receiver 80 as the input and output receivers are swept, the power measured by the output receiver 90 corresponds to residual distortion energy from the predistorted main RF amplifier 10. In this case the output of the threshold detector 89 will indicate that its threshold has not been exceeded, in response to which the DSP 30 stores the energy sensed by detector 98 in the second bin. This allows predistortion of signal transport path 16 to be adaptively controlled by minimizing the energy accumulated in the second bin.

As will be appreciated from the foregoing description of the invention, RF power amplifier distortion is readily detected, even in the presence of multi-frequency input signals, by using a common swept local oscillator to tune an RF input and an RF output receivers, which is selectively coupled to the output of the power amplifier or to a carrier cancellation combiner and the energy content of which is monitored for carrier or distortion cancellation purposes. In carrier cancellation and feedforward cancellation mode, when the power detected by the swept input receiver exceeds the power reference, the processor stores a digital representation of accumulated energy from the output receiver derived from the output of the carrier cancellation combiner. Otherwise, it accumulates energy derived from the output of the main amplifier associated with feedforward cancellation.

In predistortion mode, the output receiver monitors only the carrier cancellation combiner. Unless the carrier power threshold is exceeded, any power measured by the output receiver corresponds to only residual distortion energy from the predistorted main amplifier. This allows predistortion to be adaptively controlled by minimizing the accumulated energy during a complete band sweep of the input and output receivers, where the output receiver monitors only the output of the carrier cancellation combiner.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all changes and modifications as are obvious to one of ordinary skill in the art.

What is claimed:

1. An RF power amplifier arrangement comprising:
   an RF input port to which an RF input signal is applied;
   an RF output port from which an amplified RF output signal is derived;
   a main RF signal path containing an RF power amplifier between said RF input and output ports;
   a carrier cancellation combiner coupled to said RF input port and an output path from said RF power amplifier;
   a feedforward error correction and reinjection path containing an auxiliary RF error amplifier coupled between said carrier cancellation combiner and said output path from said RF power amplifier;
   a frequency swept input receiver coupled to monitor energy contained in said RF input signal;
   a frequency swept output receiver selectively coupled to monitor energy in one of said output path from said RF power amplifier and an output of said carrier cancellation combiner; and
   a control unit which is operative to selectively couple said frequency swept output receiver to one of said output path from said RF power amplifier and said output of said carrier cancellation combiner, so as to monitor energy received by said frequency swept output receiver, and control characteristics at least one of said main RF signal and feedforward error correction and reinjection paths.

2. An RF power amplifier arrangement according to claim 1, wherein, during the entirety of a frequency band sweep of said input and output receivers, said control unit is operative to couple said frequency swept output receiver to said output of said carrier cancellation combiner, and to store first information representative of energy received by said output receiver when said input receiver detects RF carrier power in excess of a threshold, and to store second information representative of energy received by said output receiver when said input receiver detects RF carrier power at or less than said threshold.

3. An RF power amplifier arrangement according to claim 2, wherein said control unit is operative to control characteristics of said main RF signal path in accordance with said second information representative of energy received by said output receiver when said input receiver detects RF carrier power at or less than said threshold.

4. An RF power amplifier arrangement according to claim 2, wherein said main RF signal path includes an RF predistortion correction unit that controllably imparts predistortion onto said RF input signal upstream of said RF power amplifier, so as to reduce distortion contributed by said RF power amplifier, and wherein said control unit is operative to control predistortion characteristics of said predistortion correction unit in accordance with said second information representative of energy received by said output receiver when said input receiver detects RF carrier power at or less than said threshold.

5. An RF power amplifier arrangement according to claim 4, wherein said control unit is operative to control predistortion characteristics of said predistortion correction unit so as to minimize the value of said second information representative of energy detected by said swept output receiver.

6. An RF power amplifier arrangement according to claim 1, wherein, during a frequency band sweep of said input and output receivers, said control unit is operative to couple said frequency swept output receiver to said output of said carrier cancellation combiner, and to store first information representative of energy received by said output receiver, in response to said input receiver detecting RF carrier power energy in excess of a threshold, and to couple said frequency swept output receiver to said output path from said RF power amplifier and to store second information representative of energy received by said output receiver, in response to said input receiver detecting RF carrier power at or less than said threshold.

7. An RF power amplifier arrangement according to claim 6, wherein said main RF signal path includes a controllable gain and phase adjustment circuit upstream of said RF power amplifier, and wherein said control unit is operative to adjust parameters of said controllable gain and phase adjustment circuit in accordance with said second information representative of energy received by said output receiver when said input receiver detects RF carrier power in excess of said threshold.

8. An RF power amplifier arrangement according to claim 7, wherein said control unit is operative to control said controllable gain and phase adjustment circuit, so as to minimize the value of said second information representative of the energy detected by said swept output receiver.

9. An RF power amplifier arrangement according to claim 6, wherein said feedforward error correction and reinjection path includes a controllable gain and phase adjustment circuit upstream of said auxiliary RF error amplifier, and wherein said control unit is operative to adjust parameters of said controllable gain and phase adjustment circuit in accordance with said first information representative of energy received by said output receiver when said input receiver detects RF carrier power less than or at said threshold.

10. An RF power amplifier arrangement according to claim 9, wherein said control unit is operative to control said controllable gain and phase adjustment circuit, so as to minimize the value of said first information representative of the energy detected by said swept output receiver.

11. A method of measuring and compensating for distortion in an RF power amplifier coupled over a main RF signal path to an RF input port, to which an RF input signal is coupled, and having an output path coupled to an RF output port, from which an amplified RF output signal is derived, said method comprising the steps of:

(a) coupling a carrier cancellation combiner to said RF input port and said output path from said RF power amplifier;

(b) coupling a feedforward error correction and reinjection path containing an auxiliary RF error amplifier between said carrier cancellation combiner and said output path from said RF power amplifier;

(c) coupling a frequency swept input receiver to said RF input port;

(d) selectively coupling a frequency swept output receiver to one of said output path from said RF power amplifier and an output of said carrier cancellation combiner; and (e) controlling characteristics at least one of said main RF signal and feedforward error correction and reinjection paths in accordance with energy received by said frequency swept output receiver.

12. A method according to claim 11, wherein step (d) comprises coupling said frequency swept output receiver to said output of said carrier cancellation combiner during the entirety of a frequency band sweep of said input and output receivers, and step (e) comprises storing first information representative of energy received by said output receiver when said input receiver detects RF carrier power in excess of a threshold, and storing second information representative of energy received by said output receiver when said input receiver detects RF carrier power at or less than said threshold.

13. A method according to claim 12, wherein step (e) comprises controlling characteristics of said main RF signal path in accordance with said second information representative of energy received by said output receiver when said input receiver detects RF carrier power at or less than said threshold.

14. A method according to claim 12, wherein said main RF signal path includes an RF predistortion correction unit that controllably imparts predistortion onto said RF input signal upstream of said RF power amplifier, so as to reduce distortion contributed by said RF power amplifier, and wherein step (e) comprises controlling predistortion characteristics of said predistortion correction unit in accordance with said second information representative of energy received by said output receiver when said input receiver detects RF carrier power at or less than said threshold.

15. A method according to claim 14, wherein step (e) comprises controlling predistortion characteristics of said predistortion correction unit so as to minimize the value of information representative of the energy detected by said swept output receiver.

16. A method according to claim 11, wherein, during a frequency sweep of said input and output receivers, step (d) comprises coupling said frequency swept output receiver to said output of said carrier cancellation combiner in response to said input receiver detecting RF carrier power in excess of a threshold, and step (e) comprises storing first information representative of energy received by said output receiver, and step (d) further comprises coupling said frequency swept output receiver to said output path from said RF power amplifier in response to said input receiver detecting RF carrier power at or less than said threshold, and step (e) comprises storing second information representative of energy received by said output receiver.

17. A method according to claim 16, wherein said main RF signal path includes a controllable gain and phase adjustment circuit upstream of said RF power amplifier, and wherein said step (e) further comprises adjusting parameters of said controllable gain and phase adjustment circuit in accordance with said second information representative of energy received by said output receiver when said input receiver detecting RF carrier power in excess of said threshold.

18. A method according to claim 17, wherein step (e) further comprises controlling said controllable gain and phase adjustment circuit, so as to minimize the value of said second information representative of energy detected by said swept output receiver.

19. A method according to claim 16, wherein said feed-forward error correction and reinjection path includes a controllable gain and phase adjustment circuit upstream of said auxiliary RF error amplifier, and wherein step (e) further comprises adjusting parameters of said controllable gain and phase adjustment circuit in accordance with said first information representative of energy received by said output receiver when said input receiver detects RF carrier power less than or at said threshold.

20. A method according to claim 19, wherein step (e) comprises controlling said controllable gain and phase adjustment circuit, so as to minimize the value of said first information representative of the energy detected by said swept output receiver.

* * * * *